United States Patent [19]

Jeon

[11] Patent Number: 6,025,257
[45] Date of Patent: Feb. 15, 2000

[54] METHOD FOR PREPARING DIELECTRIC THIN FILM AND SEMICONDUCTOR DEVICE USING SAME

[75] Inventor: Yoo Chan Jeon, Seoul, Rep. of Korea

[73] Assignee: LG Semicon Co., Ltd., Chungcheongbuk-Do, Rep. of Korea

[21] Appl. No.: 08/692,135

[22] Filed: Aug. 5, 1996

[30] Foreign Application Priority Data

Mar. 13, 1996 [KR] Rep. of Korea .......................... 96-6725

[51] Int. Cl.$^7$ .................................................. H01L 21/44
[52] U.S. Cl. .......................... 438/608; 438/622; 438/660; 438/663; 438/661
[58] Field of Search .................. 437/60, 225; 427/80, 427/79, 126.1; 361/303, 311, 321; 357/10; 438/396, 520, 592, 653, 660, 608, 622, 661, 663

[56] References Cited

U.S. PATENT DOCUMENTS

| | | | |
|---|---|---|---|
| 4,367,265 | 1/1983 | Yu et al. | 428/697 |
| 4,380,559 | 4/1983 | Mandai et al. | 427/80 |
| 4,403,236 | 9/1983 | Mandai et al. | 357/10 |
| 4,437,139 | 3/1984 | Howard | 361/313 |
| 4,739,544 | 4/1988 | Okazaki et al. | 29/25.42 |
| 5,036,424 | 7/1991 | Yokotani et al. | 361/321 |
| 5,142,437 | 8/1992 | Kammerdimer et al. | 361/313 |
| 5,166,759 | 11/1992 | Ueno et al. | 257/624 |
| 5,181,157 | 1/1993 | Chazono et al. | 361/321 |
| 5,248,640 | 9/1993 | Sano et al. | 501/137 |
| 5,268,006 | 12/1993 | Ueno et al. | 29/25.03 |
| 5,273,927 | 12/1993 | Gnadinger | 438/253 |
| 5,312,790 | 5/1994 | Sengupta et al. | 501/137 |
| 5,335,138 | 8/1994 | Sandhu et al. | 361/303 |
| 5,383,088 | 1/1995 | Chapple-Sokol et al. | 361/305 |
| 5,393,352 | 2/1995 | Summerfelt | 148/33.3 |
| 5,471,364 | 11/1995 | Summerfelt et al. | 361/321.4 |
| 5,527,567 | 6/1996 | Desu et al. | 427/573 |
| 5,587,870 | 12/1996 | Anderson et al. | 361/311 |
| 5,620,739 | 4/1997 | Azuma et al. | 427/79 |
| 5,717,250 | 2/1998 | Schuele et al. | 257/754 |
| 5,789,268 | 10/1995 | Chivukula et al. | 438/240 |

FOREIGN PATENT DOCUMENTS

| | | |
|---|---|---|
| 0617439 | 3/1994 | European Pat. Off. . |
| 5109982 | 4/1993 | Japan . |
| 6-350029 | 12/1994 | Japan . |
| 6-350100 | 12/1994 | Japan . |

OTHER PUBLICATIONS

English Abstract for 06–350,100 (taken from DIALOG®).
English Abstract for 06–350,029 (taken from DIALOG®).

*Primary Examiner*—Charles Bowers
*Assistant Examiner*—Reneé R. Berry
*Attorney, Agent, or Firm*—Morgan, Lewis & Bockius LLP

[57] ABSTRACT

A process for preparing a semiconductor device using a dielectric thin film includes the steps of forming a first electrode on a base plate; forming a dielectric film on the first electrode, the dielectric film including a Perovskite structure oxide; forming a second electrode on the dielectric film; and annealing the first and second electrodes so that metal components of the first and second electrodes are oxidized and diffused into a crystal system of the dielectric film.

34 Claims, 2 Drawing Sheets

METHOD FOR PREPARING DIELECTRIC THIN FILM AND SEMICONDUCTOR DEVICE USING SAME

BACKGROUND OF THE INVENTION

1. Field of the Invention

The present invention relates to a method for preparing a dielectric thin film, and more specifically, to a method for preparing a dielectric thin film with a high dielectric constant and a method for preparing a semiconductor device using the same.

2. Discussion of the Related Art

Generally, the area of semiconductor device capacitor is reduced as the degree of integration of the semiconductor device increases. As a result, the thickness of the dielectric film of the capacitor is reduced in order to compensate for the reduction of the condensing capacity of the capacitor. However, as the thickness of the dielectric film is reduced, a leakage current caused by tunneling increases. This leakage current in turn lowers the reliability of the semiconductor device.

To avoid having to reduce the thickness of the dielectric film, one method which increases the effective area of the capacitor by forming very complicated surface curvatures at storage node has been widely used. Although this method enables one to avoid reducing the dielectric film when combined together with a nitride film/oxide film laminating structure or an oxide film/nitride film/oxide film laminating structure having a high dielectric constant, such a method makes the process for photolithography difficult due to the complicated surface curvature. It also leads to a high manufacturing cost. Due to the above problems, it is predicted that such a method will be difficult to use in a highly integrated element (e.g., a DRAM with a storage capacity greater than 256 M).

To greatly enhance the condensing capacity of a capacitor and reduce its surface curvature, a method using substances with a high dielectric constant as a dielectric film of the capacitor has been proposed and many studies have been conducted. For example, $Ta_2O_5$ is most widely studied as a substance with a high dielectric constant for a capacitor. Results related to preparing $Ta_2O_5$ as a thin film to improve capacitor properties and thus solving the problems related to the high integration have been obtained. Considering the continued demand for high integration, the real dielectric constant for $Ta_2O_5$ is not very high. Thus, the range of its usage will probably not be broad.

At present, interests for a Perovskite type oxide, such as a ferroelectric body, have been raised. Such material is intensively studied to be used as a dielectric for semiconductor devices. The Perovskite type oxide materials include $Pb(Zr,Ti)O_3$(PZT), $(Pb,La)(Zr,Ti)O_3$(PLZT), $(Ba,Sr)TiO_3$ (BST), $BaTiO_3$ and $SrTiO_3$. However, these substances easily react with silicon and silicide used as substrates. In addition, electrodes are often oxidized due to exposure of their surfaces in a strong oxidizing atmosphere during the procedure for forming the Perovskite type oxide thin films. Therefore, research has been conducted to solve these problems (related to the raw material and structure of electrode).

In particular, among these strong dielectric material, BST{$Ba,Sr)TiO_3$} shows a paraelectric property at room temperature. It also has a relatively low leakage current property in addition to a high dielectric constant value of more than 2000. Because it is directly applicable to present DRAM designs, BST can be used more easily in a process for preparing the present DRAM capacitor. Thus, much research is concentrated on integration process of semiconductor devices using BST. However, these predominant properties of BST deteriorate during the course of being formed into a thin film. When BST is processed so thin as to use for a device with a high integration (e.g., more than 256 M DRAM), its dielectric constant value is decreased to 100–500, and its leakage current is increased. Therefore, confidential information stored in the device is not maintained and the reliability of the device is lowered.

The leakage current of a BST thin film varies according to the formation process of the thin BST film, the electrode material, or the electrode structure. If a Pt electrode is used instead of a $RuO_2$ electrode, the BST thin film generally shows a low leakage current because the leakage current is mainly caused by Schottky radiation from the electrode to the dielectric film.

In theory, the work function difference between the electrode material and the dielectric film differs according to the electrode. However, even though a $RuO_2$ electrode is used, the same level of low leakage current similar to that of the Pt electrode can be obtained, if BST is formed by epitaxial growth. Therefore, such work function difference may not dominantly influences the leakage current.

The results of the above epitaxial BST suggest that the presence of a crystal system increases the leakage current. To reduce such a leakage current, one widely known method is to insert a dielectric layer having a low leakage current together with BST in series between electrodes. For example, one such method using $SiO_2$, $Si_3N_4$ and $SrTiO_3$ is disclosed in U.S. Pat. No. 4,437,139 and Japanese Patent Laid-Open Hei. 6-350,029.

In this method, BST with the high dielectric constant is combined with $SiO_2$, $Si_3N_4$ and $SrTiO_3$ with the low leakage current. A substance having the low leakage current is then inserted between the electrode and the dielectric film to reduce the leakage current of the device. Since the thickness of the dielectric film is mostly formed with BST, this method attempts to use only the advantages of the two substances.

So far, BST has been used largely in individual elements of ceramic capacitors. It is usually shaped into fine powders and processed into a sheet form. An electrode is then attached thereto and this is sintered to prepare a capacitor.

Much research aimed at improving various properties of ceramic capacitors using BST has been conducted. In particular, a method where several additives are added in BST to decrease leakage current and enhance sintering property has been proposed. In this method, the dielectric constant is enhanced by increasing semiconductivity. As a result, insulation property is reduced and a substance with high insulation resistance is formed in a crystal structure in order to greatly reduce the leakage current. In U.S. Pat. No. 5,036,424, No. 5,166,759, No. 5,181,157, No. 5,248,640, No. 5,268,006 and No. 5,312,790, compositions which enhance the insulation property are disclosed and additives used are mainly Cu, Mn, Si, Al, Zn, Li, Mg, Fe, Cr, Co, Ni, B, and Pb etc. These substances play a role in insulating the crystal structure present as an oxide form having a high insulation resistance in the crystal structure in the sintering process.

In addition to methods wherein additives are mixed to raw materials, another method, wherein the previously formed BST is heated with Cu at a high temperature and Cu is added into BST by diffusing vaporized Cu into the dielectric, is disclosed in U.S. Pat. No. 4,739,544.

In Japanese Patent Laid-Open Hei 6-350,100, a method is disclosed to enhance the leakage current property of a thin dielectric film. Depending on the conductive property of the dielectric body, a donor is ion injected into the dielectric in the case of a p-type conductivity and an acceptor is ion injected into the dielectric in the case of an n-type conductivity. As a result, the number of charge carriers are decreased by counter-doping to reduce the leakage current.

The conventional methods for preparing a dielectric thin film as described above have the following problems.

First, although the dielectric constant and leakage current of a BST thin film change according to the thin film formation process, the dielectric constant and leakage current are generally in complementary relationship with each other. In other words, the leakage current is generally high in case of a high dielectric constant and the leakage current is low in case of a low dielectric constant. As a result, efforts to reduce the leakage current by controlling the formation condition of the BST thin film are generally accompanied by a reduction of the dielectric constant.

Accordingly, when a substance with a high dielectric constant (e.g., BST) is used in combination with a substance with a low leakage current, the final leakage current can be reduced. However, since substances with low leakage currents are generally materials with low dielectric constants, it is inevitable that the total dielectric constant is lowered when such material is used in combination with BST.

A related problem occurs when combining substance with a low leakage current with BST. In the operation of DRAM, both directional and anti-directional voltages are usually applied to capacitors. Thus, symmetry in the structure itself should be maintained since the same properties hold with respect to the applied voltages in both directions. As a leakage current prevention film is inserted in each interface of BST and both electrodes to maintain the symmetry, the proportion of substance with a low dielectric constant becomes high and the total dielectric constant will be further reduced.

The second problem associated with the conventional methods is that they are only suitable for certain processes. In a method for preparing a ceramic capacitor individual element, the most widely used method for preventing the leakage current is to use additives to insulate the crystal system. More specifically, before the dielectric shaping, additives are mixed together with the BST raw material powder. After the shaping, electrodes are attached thereto and the resulting product is then sintered to prepare a capacitor. Such a method is not suitable for a process for preparing an individual element with a bulky volume, nor suitable for a direct circuit process using fine elements.

Third, although the conventional process (wherein the BST dielectric is shaped and vapor-phase Cu is then diffused in BST) may be used to prepare integrated circuits, the semiconductor base plate has to be charged in a container maintained with a Cu atmosphere and annealed. Accordingly, a closed environment is required to maintain the metal vapor (Cu) atmosphere and to insulate the harmful ingredients contained in the metal vapor from human operators. In addition, when a substance having a low vapor pressure is used, it is heated to exceeding high temperatures to form additive atmosphere. Furthermore, because these metals are easily oxidized materials, oxygen has to be maintained at a very low concentration during the diffusion of the additives.

Fourth, the method of adding impurities by ion injection has the following problems. This method decreases conductivity by reducing the concentration of charge return particles in a crystal structure of dielectric. Hence, if the crystal system is a main path of the leakage current, this method is not very effective. In addition, production cost becomes high because ion injection is a expensive process.

SUMMARY OF THE INVENTION

Accordingly, the present invention is directed to a method for preparing a dielectric thin film and a semiconductor device using the same that substantially obviates one or more of the problems due to limitations an disadvantages of the related art.

An object of the present invention is to provide a dielectric thin film with a high dielectric constant, and at the same time, provide a method for preparing a semiconductor device by using the dielectric thin film with a reduced leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for preparing a dielectric thin film according to the present invention includes the steps of laminating a metal thin film and a dielectric thin film which contains a Perovskite type oxide as a main component on a substrate; and annealing thereof so that the metal component of the metal thin film may be oxidized by diffusing into the crystal structure of the dielectric thin film.

In another aspect, the method for preparing a semiconductor device using a dielectric thin film according to the present invention comprises the steps of forming a first electrode with metal, which contains a metal component having a high insulation resistance in oxidation, on a substrate; forming a dielectric thin film, which contains a Perovskite type oxide as a main component, on the first electrode; forming a second electrode, identical to the first electrode, on the dielectric thin film; and annealing metal component of the first and second electrodes to be oxidized by diffusing in a crystal structure of the dielectric thin film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
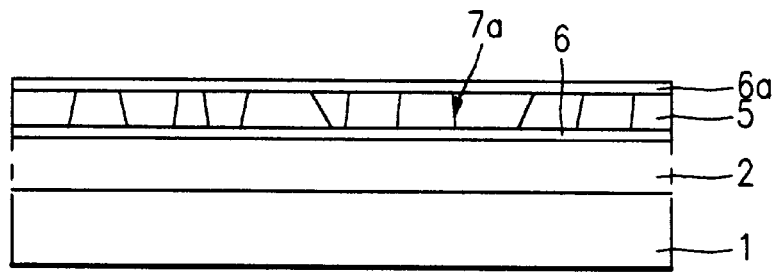
FIGS. 1A and 1B are sectional views showing the process for preparing a dielectric thin film according to a first embodiment of the present invention.
Figure 1B:
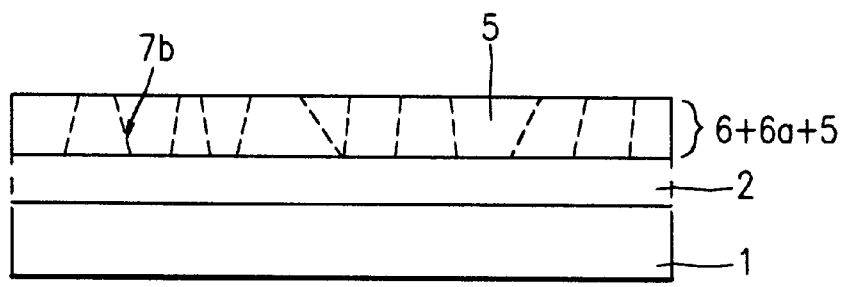

FIGS. 1A and 1B are sectional views showing the process for preparing a dielectric thin film according to a first embodiment of the present invention.

As shown in FIG. 1A, an interlayer insulation film 2 is vapor-deposited on a base plate 1, and a first metal thin film 6 is vapor-deposited with a thickness no more than 100 Å on the interlayer insulation film 2.

Next, a BST thin film 5 having a crystal structure 7a is vapor-deposited with a thickness in the range of about 200–2000 Å on the first metal thin film 6 by a suitable method such as sputtering or metal organic chemical vapor deposition (MOCVD).

At this time, the BST thin film 5 is formed by an oxide having a Perovskite type. Typically, BST $\{(Ba,Sr)TiO_3\}$ can be used alone or in addition to PZT $\{Pb(Zr,Ti)O_3\}$.

Next, a second metal thin film 6a is laminated with a thickness of no more than about 100 Å on the BST thin film 5 to be integrally in contact with the BST thin film 5.

A metal material which is capable of forming an oxide having a high insulation resistance can be used as the first and second metal thin films 6 and 6a. For example, the metal thin films are typically formed by a single metal such as Cu, Mn, Si, Al, Zn, Li, Mg, Fe, Cr, Co, Ni, B, Pb, or an alloyed metal thereof.

After the multi-layer thin film as described above is formed, it is annealed in an oxidizing atmosphere at about 700 to 1000° C. in a general furnace of processed by a rapid thermal annealing system. The metal of the metal thin films 6 and 6a are diffused into the crystal structure 7a of the BST thin film 5, as shown in FIG. 1B. At this time, if the metal of the metal thin films 6 and 6a are diffused into the crystal structure 7a of the BST thin film 5, the diffused metal is oxidized simultaneously with the diffusion process. As a result, a crystal structure 7b, wherein the oxide is diffused, is formed.

The above-described annealing process may comprise two steps. First, the metal component is diffused in an inactive atmosphere. Next, it is annealed again in an oxidizing atmosphere such as oxygen, $N_2O$ or ozone to assure the oxide formation of the diffused metal component.

In a second embodiment of the present invention, a metal thin film 6 or 6a is vapor-deposited only once just before or after the formation of the above BST thin film 5 as described in the first embodiment. Thus, in the second embodiment, the two-step annealing process of the first embodiment is not required.

A method for preparing a dielectric thin film according to a third embodiment of the present invention will now be described. As in the first embodiment, an interlayer insulation film 2 is first formed on a substrate. Next, a BST thin film 5 is formed on the interlayer insulation film 2 without forming a metal thin film 6 as in the first embodiment (FIG. 1A). Then, a metal thin film is vapor-deposited on the BST thin film 5 under a condition of heating at a high temperature, so that the metal is diffused into the BST thin film simultaneously with the vapor deposition.

If the metal thin film is vapor-deposited while the BST thin film 5 is heated by, for example, heating the substrate 1, the metal component of the metal thin film is diffused into the crystal structure 7a of the BST thin film 5 simultaneously with the vapor deposition. At the same time, the metal component is oxidized to form a crystal structure 7b, i.e., the oxide is diffused.

A capacitor can be prepared by using the methods of preparing a dielectric thin film as described above.

Figure 2A:
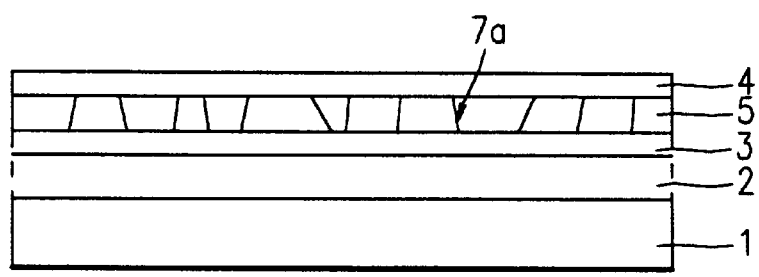
FIGS. 2A and 2B are sectional views showing the process for preparing of a semiconductor device using the dielectric thin film according to the first embodiment of the present invention.
Figure 2B:
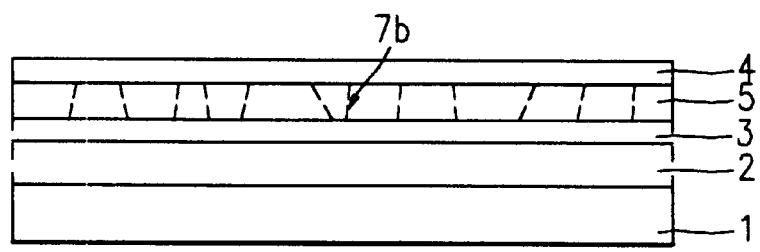

FIGS. 2A and 2B are sectional views showing the process of preparing a semiconductor device using a dielectric thin film according to the first embodiment of the present invention. The method for preparing a semiconductor device using a dielectric thin film (prepared according to the first embodiment) includes supplying a metal for oxide formation from an upper electrode or a lower electrode and diffusing the metal oxide into a crystal structure of a BST thin film.

As shown in FIG. 2A, an interlayer insulation film 2 is formed on a substrate 1. Next, a lower electrode 3 is formed on the interlayer insulation film 2. The lower electrode 3 is formed of a Pt electrode comprising metal components having a high insulation resistance after oxidation (e.g., a single metal such as Cu, Mn, Si, Al, Zn, Li, Mg, Fe, Cr, Co, Ni, B, Pb or an alloyed metal thereof). Then, a BST thin film 5 is vapor-deposited so that it is in direct contact with the lower electrode 3.

The upper electrode 4 is then formed by continual vapor-depositing platinum onto the BST thin film 5 the same way as the lower electrode 3 to form a capacitor structure.

As shown in FIG. 2B, metal components contained in the lower and upper electrodes 3 and 4 are then diffused into a crystal structure 7a of the BST thin film 5 through annealing to form a crystal structure 7b wherein the oxide is diffused. The annealing method is the same as that described in connection with FIGS. 1A and 1B.

Besides using platinum in the lower and the upper electrodes, the same effect can be achieved by using compounds having a high insulation resistance after oxidation, such as Ru, $RuO_2$, Ir, $IrO_2$, $SrRuO_3$, $YBa_2Cu_3O_7$, $(La,Sr)CoO_3$.

The method for preparing a semiconductor device by using a dielectric thin film according to the second embodiment of the present invention is as follows. In FIGS. 2A and 2B, one of the upper electrode 4 and lower electrode 3 may be formed by platinum or other metals containing metal components with a high insulation resistance after oxidation as mentioned above. The only difference is that the annealing process is omitted in this second embodiment.

Figure 3A:
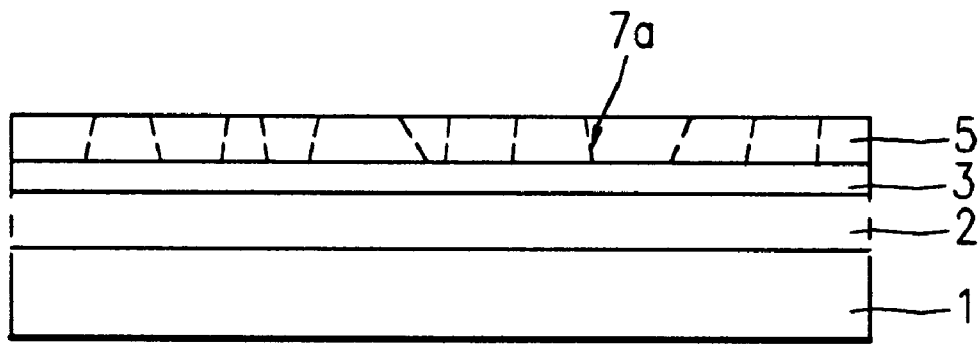
FIGS. 3A and 3B are sectional views showing the process for preparing a semiconductor device using a dielectric thin film according to a third embodiment of the present invention.
Figure 3B:
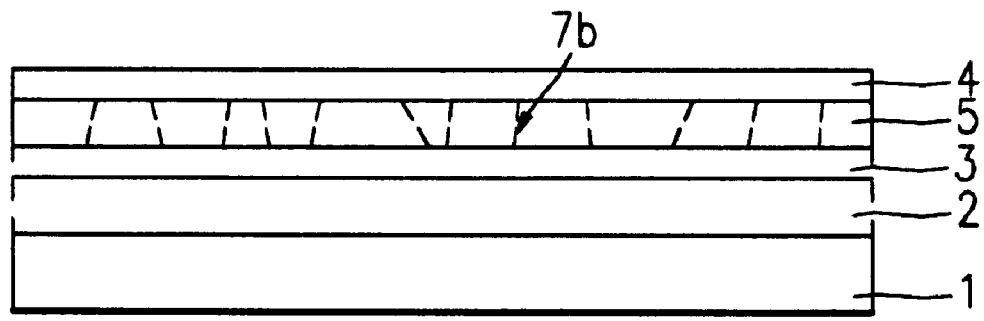

The method for preparing a semiconductor device using a dielectric thin film according to the third embodiment of the present invention is shown in FIGS. 3A and 3B. In this method, lower and upper electrodes 3 and 4 are formed of the same metal material and a dielectric thin film is formed in accordance with the same procedure as the third embodiment for preparing a dielectric thin film as described above.

As shown in FIG. 3A, the lower electrode 3 is formed and the dielectric thin film 5 is formed thereon in accordance with the same procedure as discussed for the third embodiment.

Next, the upper electrode 4 is formed on the dielectric thin film 5 as shown in FIG. 3B.

As mentioned above, the method for preparing a dielectric thin film and the method for preparing a semiconductor device by using the same according to the present invention have the following advantages.

First, while the conventional methods for reducing the leakage current of a BST thin film are often accompanied by the problem of reduced dielectric constant, and thus the reduced condensing capacity of a capacitor, the methods of crystal structure insulation provided by the present invention can effectively reduce the leakage current without reducing the dielectric constant.

Second, after a thin metal film (e.g., a sheet) is vapor-deposited on the BST thin film to contact the BST film, diffusion and oxidation are performed by annealing. As a result, the whole process is relatively simple and cheap.

Third, by using the diffusion from outside of the dielectric, an insulation layer is selectively formed on only the crystal structure having a rapid diffusion velocity. This prevents the dielectric constant of the BST thin film from decreasing due to the additives. In addition, sufficient effects can be obtained by only a short annealing process.

Fourth, when the current through the crystal structure is the dominant leakage current, it can be effectively reduced. Because this method controls the leakage current of ingredients, it is different from doping for increasing insulation resistance of the crystal structure inside. This can be applied separately from doping, and when it is used together with doping, a lower leakage current can be achieved.

Fifth, when the leakage current is reduced according to the present invention, if a dielectric film with the same thickness as in the conventional method is used, decreasing velocity of the information charges accumulated on the capacitor caused by the leakage current slows down and refresh time can be elongated as time for information storage becomes longer. If the same leakage current as in the conventional method is maintained, the thickness of the thin dielectric film can be reduced and it results in improvements of static current capacity.

It will be apparent to those skilled in the art that various modifications and variations can be made in the methods for preparing a dielectric thin film and a semiconductor device using the same of the present invention without departing from the spirit or scope of the invention. Thus, it is intended that the present invention cover the modifications and variations of this invention provided they come within the scope of the appended claims and their equivalents.

What is claimed is:

1. A process for preparing a dielectric film, comprising the steps of:
    forming a metal film and the dielectric film on a substrate, the dielectric film including a Perovskite type oxide and having a crystal structure; and
    annealing the metal film so that metal components of the metal film are oxidized and diffused into the crystal structure of the dielectric film.

2. The process according to claim 1, wherein the dielectric film includes $(Ba,Sr)TiO_3$ or $Pb(Zr,Ti)O_3$.

3. The process according to claim 1, wherein a thickness of the dielectric film is in a range of about 200–2000 Å.

4. The process according to claim 1, wherein the metal film includes a metal having a high insulation resistance after oxidation.

5. The process according to claim 4, wherein the metal film includes one of Cu, Mn, B, Si, Al, Zn, Li, Mg, Fe, Cr, Co, Ni and Pb, or an alloy thereof.

6. The process according to claim 1, wherein a thickness of the metal film is no more than about 100 Å.

7. The process according to claim 1, wherein the annealing step is performed in an oxidizing atmosphere.

8. The process according to claim 1, wherein the annealing step is performed in an inert atmosphere and then in an oxidizing atmosphere.

9. A process for preparing a dielectric film, comprising the steps of:
    forming a first metal film on a substrate;
    forming the dielectric film on the first metal film, the dielectric film including a Perovskite type oxide and having a crystal structure;
    forming a second metal film on the dielectric film; and
    annealing the first and second metal films so that metal components of the first and the second metal films are oxidized and diffused into the crystal structure of the dielectric film.

10. The process according to claim 9, wherein the dielectric film includes $(Ba,Sr)TiO_3$ or $Pb(Zr,Ti)O_3$.

11. The process according to claim 9, wherein a thickness of the dielectric film is in a range of about 200–2000 Å.

12. The process according to claim 9, wherein the metal film includes a metal having a high insulation resistance after oxidation.

13. The process according to claim 12, wherein the metal film includes one of Cu, Mn, B, Si, Al, Zn, Li, Mg, Fe, Cr, Co, Ni and Pb, or an alloy thereof.

14. The process according to claim 9, wherein a thickness of the metal film is no more than about 100 Å.

15. The process according to claim 9, wherein the annealing step is performed in an oxidizing atmosphere.

16. The process according to claim 9, wherein the annealing step is performed in an inert atmosphere and then in an oxidizing atmosphere.

17. A process for preparing a dielectric film, comprising the steps of:
    forming the dielectric film on a substrate, the dielectric film including a Perovskite type oxide and having a crystal structure; and
    forming a metal film on the dielectric film so that the metal film is oxidized and diffused into the crystal structure of the dielectric film when the metal film is annealed.

18. The process according to claim 17, wherein the dielectric film includes $(Ba,Sr)TiO_3$ or $Pb(Zr,Ti)O_2$.

19. The process according to claim 17, wherein a thickness of the dielectric film is in a range of about 200–2000 Å.

20. The process according to claim 17, wherein the metal film includes a metal having a high insulation resistance after oxidation.

21. The process according to claim 20, wherein the metal film includes one of Cu, Mn, B, Si, Al, Zn, Li, Mg, Fe, Cr, Co, Ni and Pb, or an alloy thereof.

22. The process according to claim 17, wherein a thickness of the metal film is no more than about 100 Å.

23. A process for preparing a semiconductor device, comprising the steps of:
    forming a first electrode on a substrate;
    forming a dielectric film on the first electrode, the dielectric film including a Perovskite type oxide and having a crystal structure;
    forming a second electrode on the dielectric film; and
    annealing the first and second electrodes so that metal components of the first and second electrodes are oxidized and diffused into the crystal structure of the dielectric film.

24. The process according to claim 23, wherein at least one of the first and second electrodes includes a metal component having a high insulation resistance after oxidation.

25. The process according to claim 23, wherein each of the first and second electrodes includes a metal component having a high insulation resistance after oxidation.

26. The process according to claim 23, wherein at least one of the first and the second electrodes includes platinum.

27. The process according to claim 23, wherein at least one of the first and the second electrodes includes one of Ru, $RuO_2$, Ir, $IrO_2$, $SrRuO_3$, $YBa_2Cu_3O_7$ and $(La,Sr)CoO_3$.

28. The process according to claim 23, wherein the dielectric film includes $(Ba,Sr)TiO_3$ or $Pb(Zr,Ti)O_3$.

29. The process according to claim 23, wherein a thickness of the dielectric film is in a range of about 200–2000 Å.

30. The process according to claim 23, wherein at least one of the first and the second electrodes includes one of Cu, Mn, B, Si, Al, Zn, Li, Mg, Fe, Cr, Co, Ni and Pb, or an alloy thereof.

31. The process according to claim 23, wherein at least one of the first and the second electrodes includes one of Pt, Ru, $RuO_2$, Ir, $IrO_2$, $SrRuO_3$, $YBa_2Cu_3O_7$ and $(La,Sr)CoO_3$ and has one of Cu, Mn, B, Si, Al, Zn, Li, Mg, Fe, Cr, Co, Ni and Pb, or an alloy thereof.

32. The process according to claim 23, wherein a thickness of at least one of the first and the second electrodes is no more than about 100 Å.

33. The process according to claim 23, wherein the annealing step is performed in an oxidizing atmosphere.

34. The process according to claim 23, wherein the annealing step is performed in an inert atmosphere and then in an oxidizing atmosphere.

* * * * *